(12) United States Patent
Ishikawa

(10) Patent No.: US 8,207,706 B2
(45) Date of Patent: Jun. 26, 2012

(54) METHOD OF ESTIMATING BATTERY STATE OF CHARGE

(75) Inventor: Yosuke Ishikawa, Utsunomiya (JP)

(73) Assignee: Honda Motor Co., Ltd., Tokyo (JP)

( * ) Notice: Subject to any disclaimer, the term of this patent is extended or adjusted under 35 U.S.C. 154(b) by 478 days.

(21) Appl. No.: 12/534,930

(22) Filed: Aug. 4, 2009

(65) Prior Publication Data

US 2011/0031938 A1 Feb. 10, 2011

(51) Int. Cl.
H02J 7/00 (2006.01)
(52) U.S. Cl. .................. 320/132; 320/162; 324/432
(58) Field of Classification Search .............. 320/162
See application file for complete search history.

(56) References Cited

U.S. PATENT DOCUMENTS

| | | | |
|---|---|---|---|
| 5,349,540 A | 9/1994 | Birkle et al. | |
| 6,016,047 A * | 1/2000 | Notten et al. | 320/137 |
| 6,262,577 B1 | 7/2001 | Nakao et al. | |
| 6,285,163 B1 * | 9/2001 | Watanabe et al. | 320/132 |
| 6,359,419 B1 | 3/2002 | Verbrugge et al. | |
| 6,441,586 B1 | 8/2002 | Tate, Jr. et al. | |
| 6,534,954 B1 * | 3/2003 | Plett | 320/132 |
| 6,809,433 B2 * | 10/2004 | Nozu | 307/109 |
| 6,943,528 B2 * | 9/2005 | Schoch | 320/132 |
| 7,072,871 B1 * | 7/2006 | Tinnemeyer | 706/1 |
| 7,109,685 B2 | 9/2006 | Tate, Jr. et al. | |
| 7,227,336 B1 | 6/2007 | van Schalkwijk et al. | |
| 7,327,147 B2 | 2/2008 | Koch | |
| 7,352,156 B2 | 4/2008 | Ashizawa et al. | |
| 2002/0130637 A1 * | 9/2002 | Schoch | 320/132 |
| 2006/0284600 A1 | 12/2006 | Verbrugge | |
| 2007/0005276 A1 | 1/2007 | Cho, II et al. | |
| 2008/0012571 A1 | 1/2008 | Ehrmann et al. | |
| 2009/0001992 A1 | 1/2009 | Tsuchiya | |

OTHER PUBLICATIONS

Santhanagopalan, S. and White, R.E., "Online estimation of the state of charge of a lithium ion cell," Journal of Power Sources, Jun. 19, 2006, pp. 1346-1355, vol. 161, Elsevier B.V.

G. Ning, and B.N. Popov, "Cycle Life Modeling of Lithium-Ion Batteries," Journal of Electrochemical Society, vol. 151 (2004), pp. A1584-A1591.

* cited by examiner

*Primary Examiner* — Arun Williams
(74) *Attorney, Agent, or Firm* — Capitol City TechLaw, PLLC; Mark E. Duell

(57) ABSTRACT

The present teachings are directed toward a machine implemented method for estimating the state of charge of a battery. The machine implemented method includes providing measured and estimated cell terminal voltage to a model coefficient updater to update a model coefficient. Battery current information is provided to a battery state of charge estimator along with the updated model coefficient so that the estimated state of charge can be determined. A multi-layer model can be utilized to determine the states of charge for layers of the electrodes. The method can be implemented on a processing device, and is particularly applicable to Li-ion batteries.

20 Claims, 9 Drawing Sheets

$$\begin{Bmatrix} SOC1(k+1) \\ SOC2(k+1) \\ SOC3(k+1) \end{Bmatrix} = \begin{Bmatrix} 1-D_{diff\,j}(k) & D_{diff\,j}(k) & 0 \\ D_{diff\,j}(k) & 1-2D_{diff\,j}(k) & D_{diff\,j}(k) \\ 0 & D_{diff\,j}(k) & 1-D_{diff\,j}(k) \end{Bmatrix} \begin{Bmatrix} SOC1(k) \\ SOC2(k) \\ SOC3(k) \end{Bmatrix} + \begin{Bmatrix} \frac{NTc}{3600} \\ 0 \\ 0 \end{Bmatrix} Ib(k)$$

$$\hat{V}b(k) = OCV(SOC1(k)) + RIb(k)$$

FIG. 5

$$\begin{Bmatrix} SOC1(k+1) \\ SOC2(k+1) \\ SOC3(k+1) \end{Bmatrix} = \begin{bmatrix} 1-D_{diffj}(k) & D_{diffj}(k) & 0 \\ D_{diffj}(k) & 1-2D_{diffj}(k) & D_{diffj}(k) \\ 0 & D_{diffj}(k) & 1-D_{diffj}(k) \end{bmatrix} \begin{Bmatrix} SOC1(k) \\ SOC2(k) \\ SOC3(k) \end{Bmatrix} + \begin{Bmatrix} \dfrac{NTc}{3600} \\ 0 \\ 0 \end{Bmatrix} Ib(k) + \underbrace{\begin{Bmatrix} L1(k) \\ L2(k) \\ L3(k) \end{Bmatrix}}_{} (Vb(k) - \hat{V}b(k))$$

$$\hat{V}b(k) = OCV(SOC1(k)) + RIb(k)$$

FIG. 6

METHOD OF ESTIMATING BATTERY STATE OF CHARGE

BACKGROUND

1. Field of the Invention

The present teachings relate to a machine implemented method for estimating the state of charge of a battery. This machine implemented method includes estimating the battery state of charge by use of a multi-layer model of an electrode to derive the state of charge, and utilizing battery voltage and current readings to update diffusion coefficients used by the multi-layer model to obtain a more accurate estimation of the battery state of charge. The method can be implemented on a processing device to control battery charging conditions over a charging regime to optimize the battery charging process.

2. Discussion of the Related Art

A fusion type soft computing algorithm utilized to estimate the state of charge of the battery from inputs including battery current, voltage and temperature is set forth in U.S. Patent Application Publication No. 2007/0005276 A1. Another battery management system that determines the state of charge of the battery by receiving signals such as current or voltage from the battery is discussed in U.S. Patent Application Publication No. 2009/0001992 A1. A multi-layer model of proton diffusion within a battery is discussed in U.S. Pat. No. 6,016,047.

One model used to estimate a battery's internal states is the Single Particle Battery model. This model is presented in detail in, at least, two technical papers, "Cycle Life Modeling of Lithium-Ion Batteries," G. Ning, B. N. Popov, Journal of Electrochemical Society 151 (2004), pages A1584-A1591, and "Online estimation of the state of charge of a lithium ion cell," S. Santhanagopalan, R. E. White, Journal of Power Sources 161 (2006), pages 1346-1355, both of which are incorporated herein in their entireties.

The well-known Coulomb-Counting method of estimating state of charge simply accumulates the output of the battery current sensor but is susceptible to sensor error. This sensor and calculation error is addressed by other battery model estimation methods such as those using a Kalman filter. While these methods update the state of charge estimation by comparing the model output and the actual measured cell voltage, problems arise when there is both state of charge estimation error and battery modeling error as will likely occur due to cell variation and aging of the cell. A comparison of a results obtained by a conventional filter method (solid lines) with both an initial state of charge estimation error and initial modeling error versus the actual cell voltage and state of charge (dashed lines) is illustrated in FIG. 1.

A need exists for a method that accurately determines the state of charge of a battery which information can be utilized to control a battery charging system, which can in turn, lead to an improved energy storage device, particularly for automotive applications.

SUMMARY

The present teachings are directed to a machine implemented method for estimating the state of charge of a battery. The presently taught method includes providing measured and estimated cell terminal voltages to a model coefficient updater, and then updating the model coefficient. The model coefficient can be the diffusion coefficient for ions in the active electrode material. The measured cell terminal voltage and battery current are also provided to a battery state of charge estimator, along with the updated model coefficient. The estimated state of charge of the battery and the estimated cell terminal voltage are then determined by utilizing the updated model coefficient, the battery current information, and the measured cell terminal voltage in a multi-layer model of a battery electrode. The presently disclosed method can be implemented on a processing device.

Also taught by the present disclosure is a battery management system including a battery having positive and negative electrodes, a battery charger, and a charging control system comprising a machine implemented method for determining the state of charge of an electrode. This machine implemented method includes initially providing a measured cell terminal voltage and an estimated cell terminal voltage to a model coefficient updater, and updating the model coefficient. The updated model coefficient is provided to a battery state of charge estimator along with battery current information and measured cell terminal voltage. The battery state of charge estimator can then determine an estimated state of charge of the battery and an estimated cell terminal voltage by utilizing the updated model coefficient, the battery current information, and the measured cell terminal voltage.

BRIEF DESCRIPTION OF THE DRAWINGS

The accompanying drawings, which are included to provide a further understanding of the invention and are incorporated in and constitute a part of this specification, illustrate preferred embodiments of the invention and together with the detailed description serve to explain the principles of the invention. In the drawings:

FIG. 5 is the state variable form of a multi-layer model;

FIG. 6 is the state variable form of a multi-layer model according to the present disclosure;

DETAILED DESCRIPTION

Figure 1:
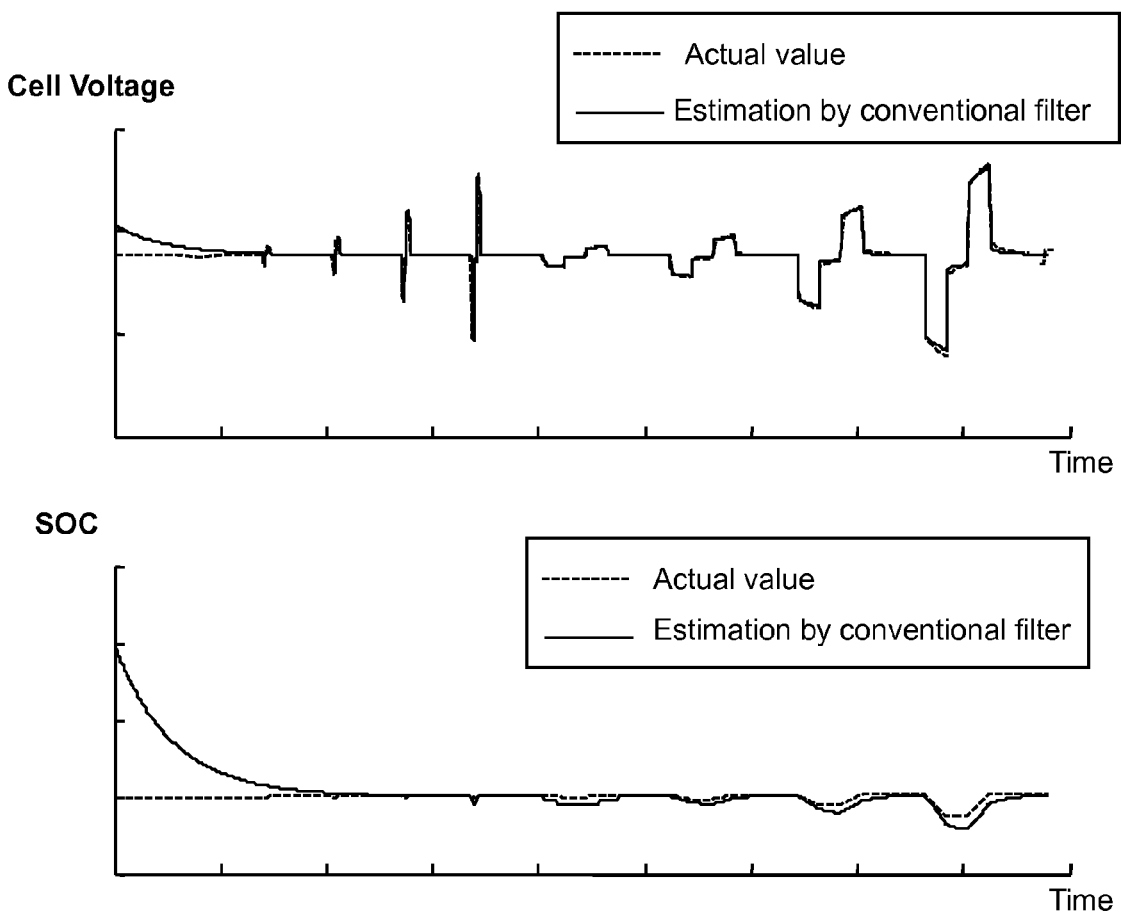
FIG. 1 is a graphical representation of the results of a conventional filter versus experimental data for cell voltage and state of charge.

The present disclosure teaches a machine implemented method for estimating the state of charge of a battery. This method can include the steps of providing measured and estimated cell terminal voltages to a model coefficient updater, and updating a model coefficient by utilizing the measured and estimated cell terminal voltages. The measured cell terminal voltage and battery current are provided to a battery state of charge estimator, along with the updated model coefficient. The estimated state of charge of the battery and an estimated cell terminal voltage are then determined by utilizing the updated model coefficient, the battery current information, and the measured cell terminal voltage in a multi-layer model of a battery electrode. The presently disclosed method can be implemented on a processing device.

In the presently disclosed method the battery can be a lithium ion battery, and the model coefficient can be a coefficient of ion diffusion within the active electrode material of at least one of the electrodes of the battery.

The battery state of charge estimator of the presently disclosed subject matter can include a multi-layer model of the ionic behavior within at least one of the electrodes. In some embodiments of the present method, the electrode can be the positive electrode of the battery. The method can be simplified by modeling only the behavior of the positive electrode as the potential of the positive electrode is typically more dominant than the negative electrode.

In the model coefficient updater utilized by the presently disclosed method, a model coefficient for a multi-layer model is updated for the electrode of interest, typically the positive electrode. The updating of the model coefficient occurs by first acquiring a measured cell terminal voltage value from a cell terminal voltage sensor, and also acquiring an estimated cell terminal voltage value from the battery state of charge estimator. Then change increments for both the measured cell terminal voltage and the estimated cell terminal voltage are determined. The absolute value of the measured battery current is compared to a predetermined value, and if the absolute value of the measured battery current is greater than the predetermined value then the absolute value of change increment for the measured cell terminal voltage is compared to the absolute value of the change increment for the estimated cell terminal voltage, and the model coefficient is updated accordingly.

The above steps are repeated until either the absolute value of the change increment for the measured cell terminal voltage is equal to the absolute value of the change increment for the estimated cell terminal voltage, or the absolute value of the measured battery current is less than the predetermined value.

The model coefficient is updated depending on the relationship between the absolute value of the change increment for the measured cell terminal voltage and the absolute value of the change increment for the estimated cell terminal voltage. When the absolute value of the change increment for the measured cell terminal voltage is greater than the absolute value of the change increment for the estimated cell terminal voltage, then the updated model coefficient is the initial model coefficient minus an incremental value, and when the absolute value of the change increment for the measured cell terminal voltage is less than the absolute value of the change increment for the estimated cell terminal voltage, then the model coefficient is updated by adding an incremental value to the initial model coefficient.

The incremental value by which the model coefficient is changed can be determined by considerations of both the speed of estimation and the amount of fluctuation in the model coefficient.

The battery state of charge estimator of the presently taught method can determine the estimated state of charge of the battery and the estimated cell terminal voltage of the battery by acquiring the measured cell terminal voltage, the cell internal resistance, and the measured battery current, and using a multi-layer model to determine the state of charge for the multiple layers of the electrode of interest.

The multi-layer model utilized in the present method solves for the estimated state of charge and the cell terminal voltage by dividing each electrode into N layers of active electrode material, where N is a whole number greater than 1, and acquiring the measured battery current and the internal resistance of the battery. The states of charge for each of the N layers of active electrode material can then be determined.

The states of charge of each of the layers of the active electrode material are a function of the difference between the respective states of charge of a layer's adjacent layers. One embodiment of this model is illustrated in FIG. 4 of the present disclosure.

The N variable of the present method can be a whole number greater than one, and can be as large a number as suitable for use of the present method. N can be selected by one of skill in the art so as to provide a balance between accuracy of the presently disclosed method and the ease of solution.

Figure 4:
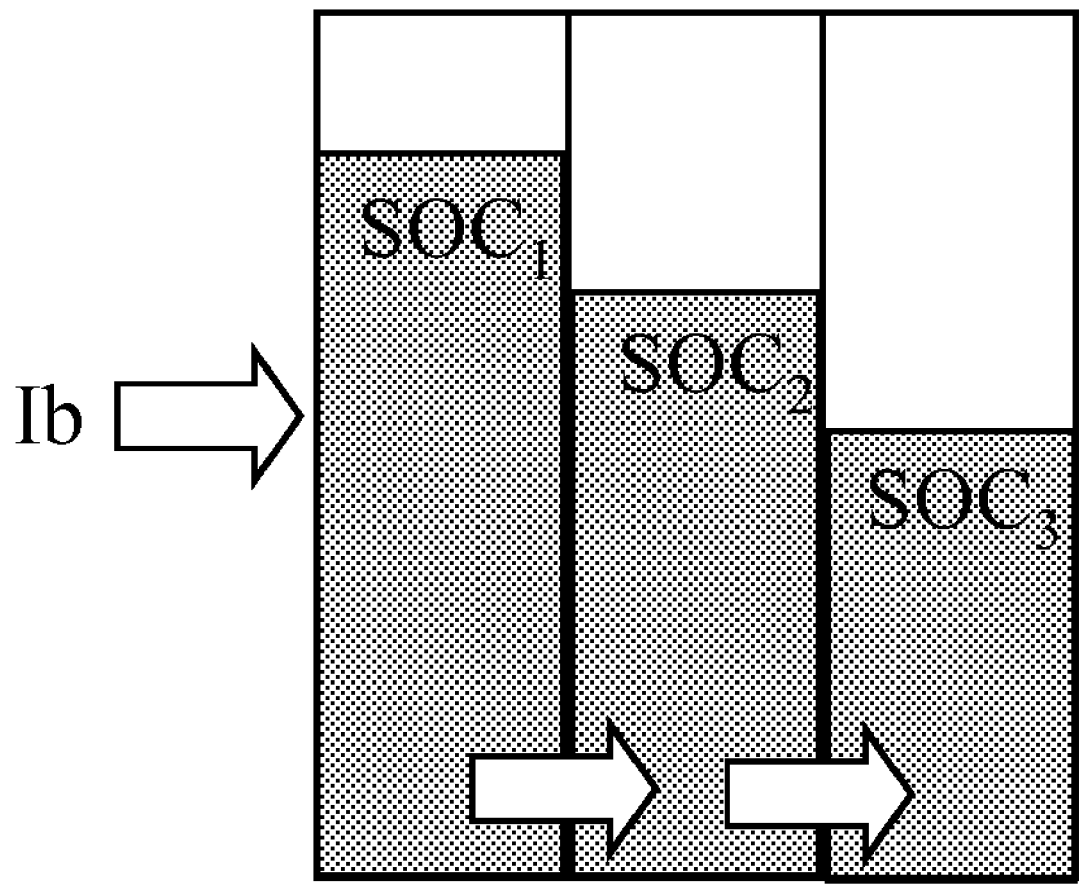
FIG. 4 is a graphical representation of an electrode divided into multiple layers for an N=3 case.

The presently taught multi-layer model is presented in the equations set forth below and is also illustrated in FIG. 4 for the case where N is equal to 3.

The state of charge of the first layer of active electrode material can be the solution to the following equation:

$$SOC_1(k+1) = SOC_1(k) - D_{diff}(SOC_1(k) - SOC_2(k)) + \frac{NT_c}{3600}I_b(k).$$

The state of charge for each of the 2nd through the $N-1^{th}$ layer of active electrode material can be the respective solutions to the following equation:

$$SOC_{i+1}(k+1) = SOC_{i+1}(k) + D_{diff}(SOC_i(k)) - SOC_{i+1}(k)) - D_{diff}(SOC_{i+1}(k) - SOC_{i+2}(k))$$

for i=1 to N.

The state of charge of the $N^{th}$ layer of active electrode material can be the solution to the following equation:

$$SOC_N(k+1) = SOC_N(k) + D_{diff}(SOC_{N-1}(k) - SOC_N(k)).$$

In the equations set forth herein, the following definitions apply:

$I_b$ Current to the battery in C rate $SOC_i$ Local SOC of active electrode material at each layer i=1 (outermost layer), i=N (innermost layer)

$D_{diff}$ Diffusion coefficient, and $T_c$ Update interval (second).

The multi-layer model utilized herein can be expressed in state variable form with the output being the estimated cell terminal voltage, $\hat{V}b(k)$, and the estimated state of charge. The open circuit voltage ("OCV") of the battery is a non-linear function of the battery's state of charge, and R is the internal resistance of the battery. The internal resistance can be obtained by a prior experiment or a real-time estimation method such as the method described in Japanese patent document, JP 2009-103471, which is incorporated herein for all purposes. An example of the state variable expression with N equal to 3 is set forth in FIG. 5.

In presently disclosed method, an additional term which expresses the difference between the measured cell terminal voltage, Vb(k), and the estimated cell terminal voltage is included. This additional term provides feedback of the model output error to obtain a more accurate estimation of the state of charge. An example of this state variable expression with the additional feedback term is set forth in FIG. 6.

To simplify solution of the state variable equation, the multi-layer model can be solved for only the positive electrode as its behavior tends to be more dominant than the negative electrode.

The present disclosure also includes a battery management system including a battery having positive and negative electrodes, a battery charger, and a charging control system composed of a machine implemented method for determining the state of charge of either electrode. This machine implemented method includes initially providing a measured cell terminal voltage and an estimated cell terminal voltage to a model coefficient updater, and updating the model coefficient. The updated model coefficient is provided to a battery state of charge estimator along with battery current information and measured cell terminal voltage. The battery state of charge estimator can then determine an estimated state of charge of the battery and an estimated cell terminal voltage by utilizing the updated model coefficient, the battery current information, and the measured cell terminal voltage. The presently disclosed battery management system can be implemented on a processing device, as described in further detail below.

In the battery management device described herein, the battery charger for charging the battery can be a generator, such as, for example, a generator for a hybrid electric vehicle in some embodiments. This battery management device can be particularly applicable to lithium ion batteries, although application of the device is not so limited.

The processing device which can carry out the battery management system described herein can include a processor, a random access memory, a read only memory, an input device, an output device, and a bus, wherein the bus connects the processor to one of more of the random access memory, the read only memory, the input device, and the output device, and the processor comprises a central processing unit.

Hybrid electric vehicle refers to vehicles that can incorporate two different sources of drive train power, for instance, an electric motor, and additionally, an internal combustion engine, for example, a gasoline or diesel powered engine.

Figure 2:
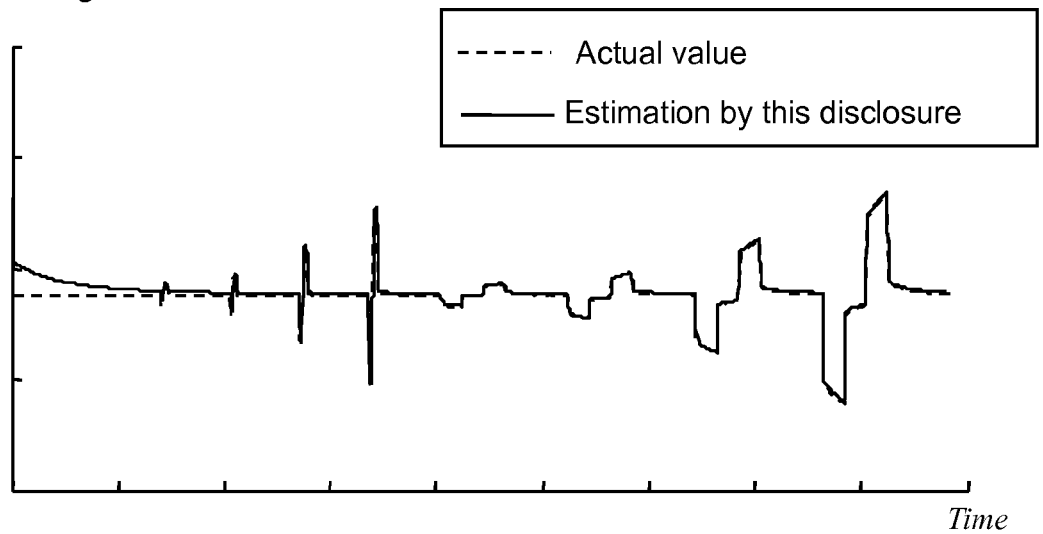
FIG. 2 is a graphical representation of the results of the present disclosure versus experimental data for cell voltage and state of charge.
Figure 2:
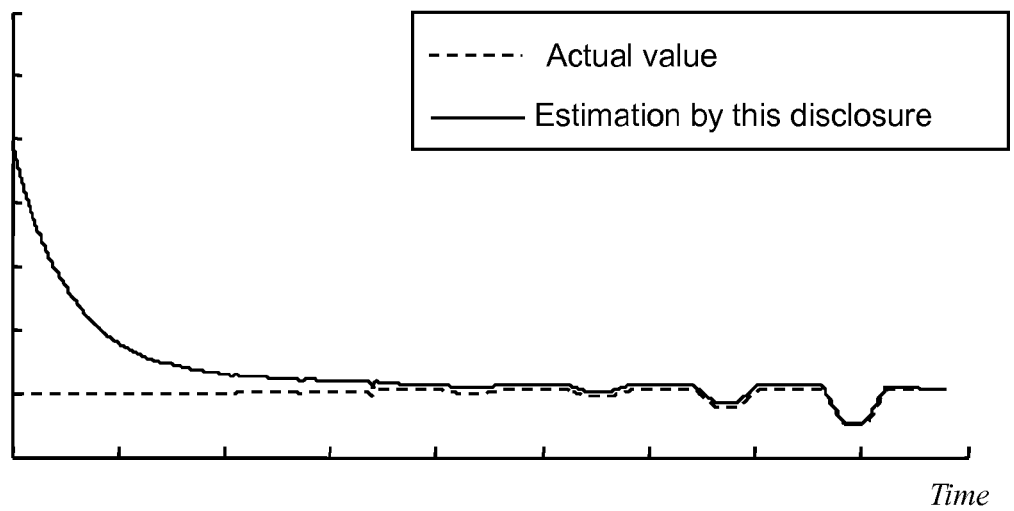

A comparison of cell voltage and state of charge estimations (solid lines) obtained with the presently disclosed multi-layer model versus the actual measured values (dashed lines) is graphically presented in FIG. 2. Here, the experimental results (dashed line) are more closely matched by the methods and devices of the present disclosure than the results from more conventional methods as illustrated in FIG. 1. With the presently disclosed method, it is possible to more closely match the experimental results by updating the model coefficient and the estimated cell terminal voltage on a real time basis and obtaining suitable results regardless of the variation in battery behavior due to aging or other conditions.

Figure 7:
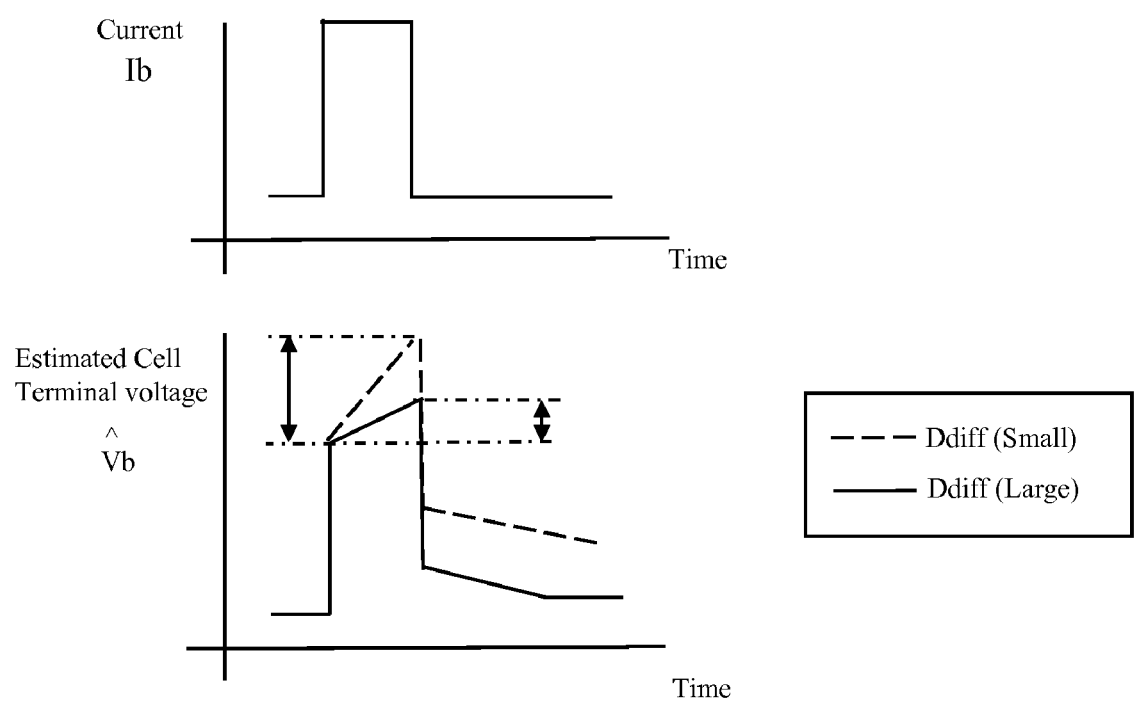
FIG. 7 is a graphical representation of the effect of magnitude of the diffusion coefficient on estimated cell terminal voltage.

As set forth in FIG. 7, the model coefficient, $D_{diff}$, impacts the transient behavior of the estimated cell terminal voltage obtained by the presently disclosed method. Shown here, a smaller $D_{diff}$ results in faster transient behavior for the estimated cell terminal voltage. This relationship can be utilized in updating the model coefficient.

Figure 3:
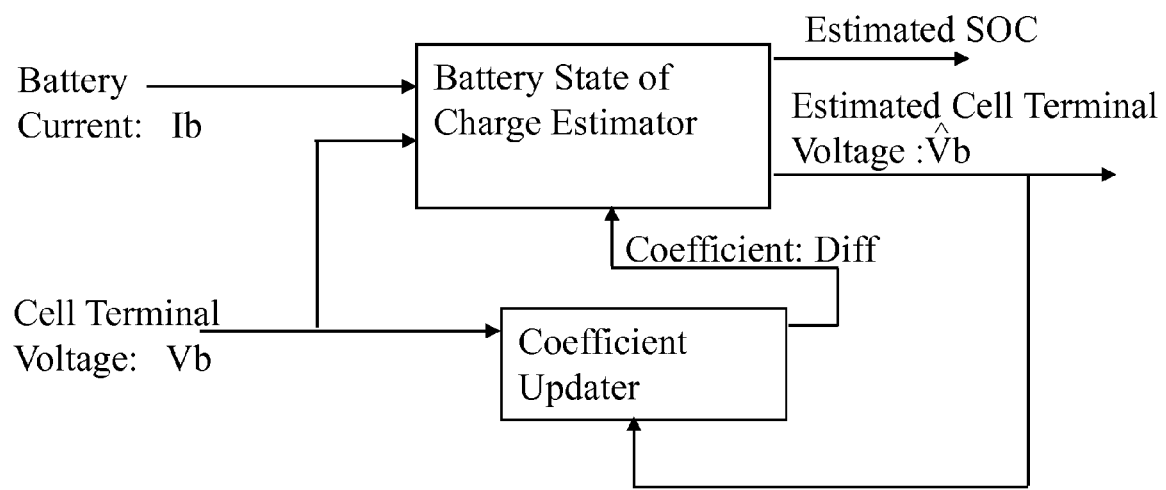
FIG. 3 is a schematic of the presently disclosed method.
Figure 8:
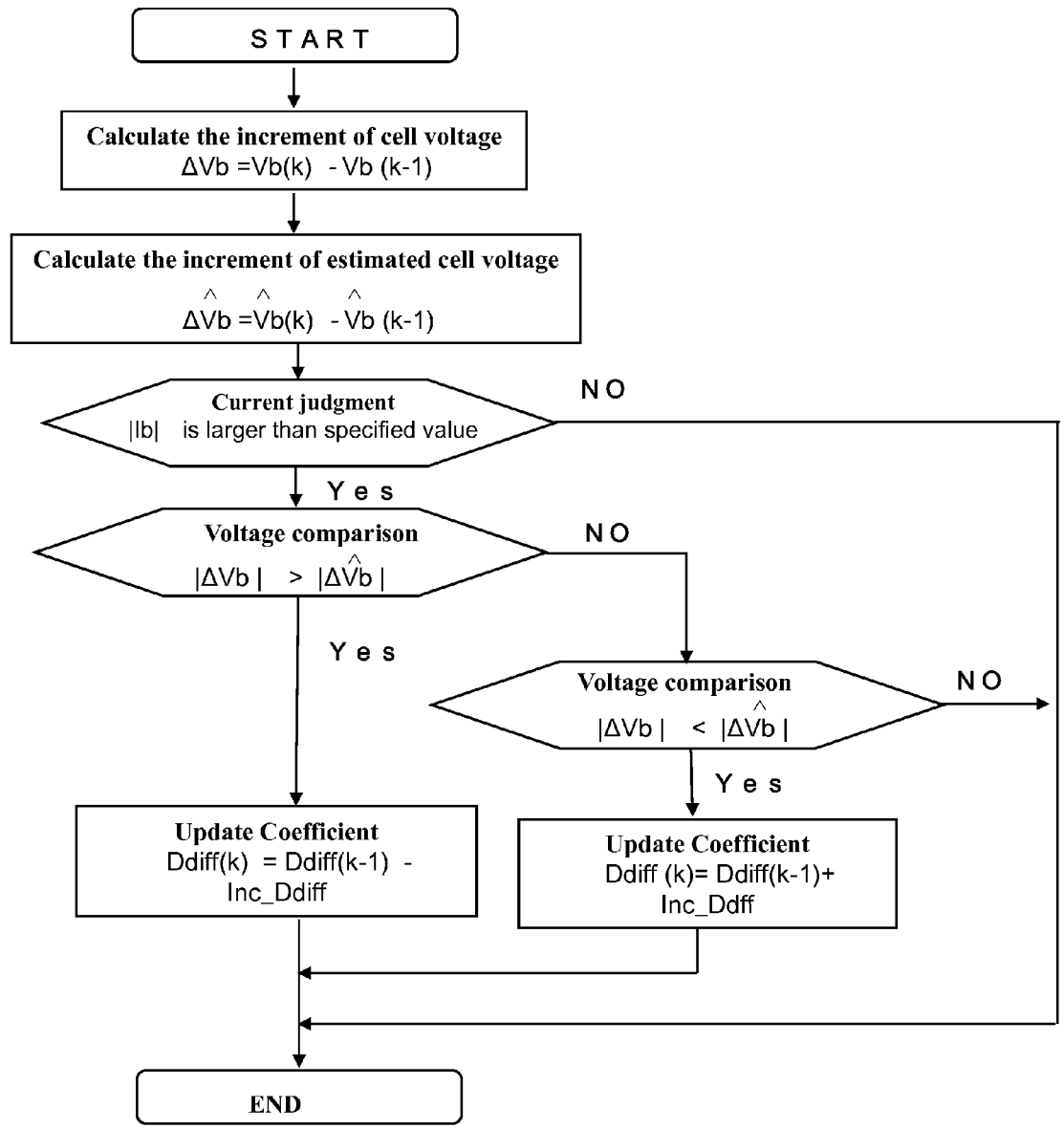
FIG. 8 is a schematic of the presently disclosed model coefficient updater.

A general schematic overview of one embodiment of the present method is presented in FIG. 3 with FIG. 8 showing the decision path of one embodiment of the voltage comparison section of the model coefficient updater.

Figure 9:
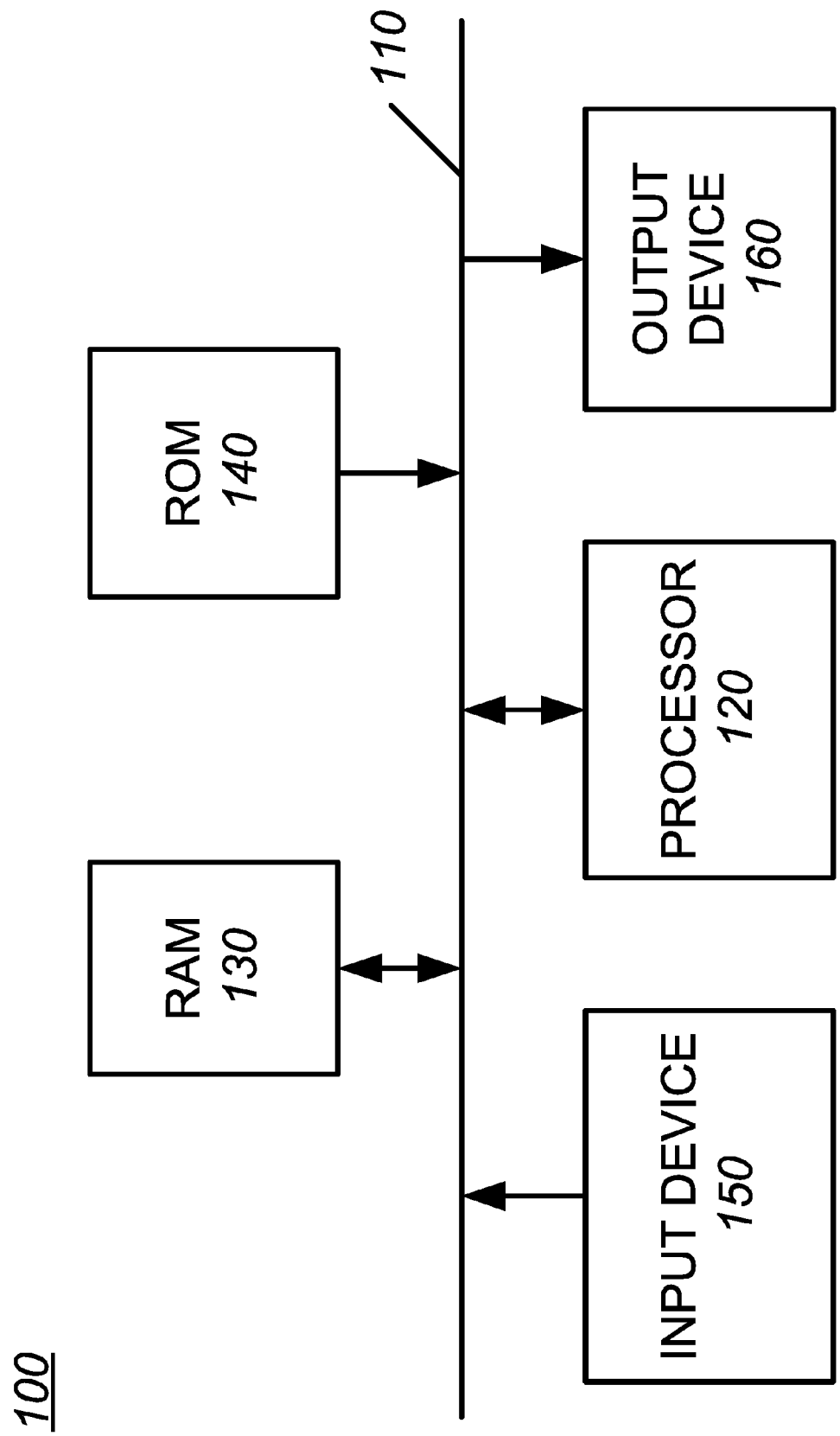
FIG. 9 is a schematic diagram of an exemplary processing device according to the present disclosure.

FIG. 9 illustrates an exemplary processing device 100, which may be used to implement embodiments consistent with the presently disclosed subject matter. Processing device 100 may be a battery control device, a subsystem of a battery charging system, an engine control module on an automotive vehicle, a personal computer ("PC"), a handheld processing device, or another type of processing device. Processing device 100 may include a bus 110, a processor 120, a random access memory ("RAM") 130, a read only memory ("ROM") 140, an input device 150, and an output device 160. Bus 110 may connect processor 120 to RAM 130, ROM 140 and output device 160.

Processor 120 may include one or more conventional processors that interpret and execute instructions, including, but not limited to a central processing unit ("CPU"). A memory may include RAM 130, ROM 140, and/or another type of dynamic or static storage device that stores information and instructions for execution by processor 120. RAM 130, or another type of dynamic storage device, may store instructions as well as temporary variables or other intermediate information used during execution of instructions by processor 120. ROM 140, or another type of static storage device, may store static information and instructions for processor 120.

Input device 150 may include a data input source such as input from a battery condition sensor, such as, a cell terminal voltage sensor, a battery voltage sensor, or a battery current sensor, or other device for providing input. Output device 160 may include a data output for data to be inputted into another step of the presently disclosed method, or other device for outputting information.

Processing device 100 may perform functions in response to processor 120 executing sequences of instructions contained in a tangible machine-readable medium, such as, for example, RAM 130, ROM 140 or other medium. Such instructions may be read into RAM 130 from another tangible machine-readable medium or from a separate device via a communication interface (not shown). Analog to digital, and digital to analog converters can also be present in the processing device as needed.

As used herein, "adjacent" refers to articles or layers having a common boundary or edge, that is, touching.

The present application is related to co-pending U.S. patent application Ser. No. 12/129,416 filed May 29, 2008, U.S. patent application Ser. No. 12/236,103 filed Sep. 22, 2008, and U.S. patent application Ser. No. 12/500,654 filed Jul. 10, 2009, which are hereby incorporated herein in their entireties for all purposes.

All publications, articles, papers, patents, patent publications, and other references cited herein are hereby incorporated herein in their entireties for all purposes.

Although the foregoing description is directed to the preferred embodiments of the present teachings, it is noted that other variations and modifications will be apparent to those skilled in the art, and which may be made without departing from the spirit or scope of the present teachings.

The foregoing detailed description of the various embodiments of the present teachings has been provided for the purposes of illustration and description. It is not intended to be exhaustive or to limit the present teachings to the precise embodiments disclosed. Many modifications and variations will be apparent to practitioners skilled in this art. The embodiments were chosen and described in order to best explain the principles of the present teachings and their practical application, thereby enabling others skilled in the art to understand the present teachings for various embodiments and with various modifications as are suited to the particular use contemplated. It is intended that the scope of the present teachings be defined by the following claims and their equivalents.

I claim:

1. A machine implemented method for estimating the state of charge of a battery, the machine implemented method comprising:

providing a measured cell terminal voltage and an estimated cell terminal voltage to a model coefficient updater;

updating a model coefficient by utilizing the measured cell terminal voltage and estimated cell terminal voltage;

providing battery current and measured cell terminal voltage to a battery state of charge estimator;

providing the updated model coefficient to the battery state of charge estimator, and determining an estimated state of charge of the battery and an estimated cell terminal voltage by utilizing the updated model coefficient, the battery current information, and the measured cell terminal voltage, wherein the method is implemented on a processing device, and the battery comprises at least one positive electrode and one negative electrode.

2. The method according to claim 1, wherein the battery comprises a lithium ion battery.

3. The method according to claim 1, wherein the model coefficient comprises a coefficient of ion diffusion within at least one of the electrodes of the battery.

4. The method according to claim 1, wherein the battery state of charge estimator comprises a multi-layer model of the ionic behavior within at least one of the electrodes.

5. The method according to claim 4, wherein the electrode comprises the positive electrode of the battery.

6. The method according to claim 1,
wherein the model coefficient updater updates a model coefficient for a multi-layer model for an electrode of interest by
a) acquiring a measured cell terminal voltage value from a cell terminal voltage sensor;
b) acquiring an estimated cell terminal voltage value from the battery state of charge estimator;
c) determining the change increment for the measured cell terminal voltage;
d) determining the change increment for the estimated cell terminal voltage;
e) comparing the absolute value of the battery current to a predetermined value, and if the absolute value of the battery current is greater than the predetermined value then
f) comparing the absolute value of change increment for the measured cell terminal voltage to the absolute value of the change increment for the estimated cell terminal voltage;
g) updating the model coefficient, and
repeating steps a) through g) until either the absolute value of the change increment for the measured cell terminal voltage is equal to the absolute value of the change increment for the estimated cell terminal voltage, or the absolute value of the battery current is less than the predetermined value.

7. The method according to claim 6,
wherein when the absolute value of the change increment for the measured cell terminal voltage is greater than the absolute value of the change increment for the estimated cell terminal voltage, then
the updated model coefficient comprises the initial model coefficient minus an incremental value.

8. The method according to claim 6,
wherein when the absolute value of the change increment for the measured cell terminal voltage is less than the absolute value of the change increment for the estimated cell terminal voltage, then
the updated model coefficient comprises the initial model coefficient plus an incremental value.

9. The method according to claim 6, wherein the model coefficient comprises a coefficient of ion diffusion within at least one of the electrodes of the battery.

10. The method according to claim 1,
wherein the battery state of charge estimator determines the estimated state of charge of the battery and the estimated cell terminal voltage of the battery by:
acquiring the measured cell terminal voltage, the cell internal resistance, and the measured battery current;
using a multi-layer model to determine the state of charge for the multiple layers of the electrode of interest, and then
determining the estimated cell terminal voltage and the estimated state of charge of the battery.

11. The method according to claim 10, wherein the multi-layer model comprises
dividing each electrode into N layers of active electrode material;
acquiring the measured battery current;
acquiring the internal resistance of the battery;
determining the open circuit voltage of the battery, and
determining the state of charge for each of the layers of the active electrode material; and
wherein the state of charge of each of the layers of the active electrode material comprises a function of the difference between the respective states of charge of a layer's adjacent layers, and
wherein N is a whole number greater than 1.

12. The method according to claim 10, wherein the electrode of interest comprises the positive electrode.

13. The method according to claim 11, wherein the state of charge of the first layer of active electrode material comprises the solution to the following equation:

$$SOC_1(k+1) = SOC_1(k) - D_{diff}(SOC_1(k) - SOC_2(k)) + \frac{NT_c}{3600}I_b(k).$$

14. The method according to claim 11, wherein the state of charge for each of the 2nd through the N−1$^{th}$ layer of active electrode material comprises the respective solutions to the following equation:

$$SOC_{i+1}(k+1) = SOC_{i+1}(k) + D_{diff}(SOC_i(k) - SOC_{i+1}(k)) - D_{diff}(SOC_{i+1}(k) - SOC_{i+2}(k))$$

for i=1 to N.

15. The method according to claim 11, wherein the state of charge of the N$^{th}$ layer of active electrode material comprises the solution to the following equation:

$$SOC_N(k+1) = SOC_N(k) + D_{diff}(SOC_{N-1}(k) - SOC_N(k)).$$

16. A battery management device comprising:
a battery having positive and negative electrodes;
a battery charger for charging the battery; and
a charging control system comprising a machine implemented method for determining the state of charge of either electrode of the battery, the machine implemented method comprising:
providing a measured cell terminal voltage and an estimated cell terminal voltage to a model coefficient updater;
updating a model coefficient by utilizing the measured cell terminal voltage and estimated cell terminal voltage;
providing battery current information and measured cell terminal voltage to a battery state of charge estimator;
providing the updated model coefficient to the battery state of charge estimator; and
determining an estimated state of charge of the battery and an estimated cell terminal voltage by utilizing the updated model coefficient, the battery current information, and the measured cell terminal voltage,
wherein the method is implemented on a processing device.

17. A battery management device according to claim 16, wherein the battery charger for charging the battery comprises a generator.

18. A battery management device according to claim 16, wherein the battery charger for charging the battery comprises a generator for a hybrid electric vehicle.

19. A battery management device according to claim 16, wherein the battery comprises a lithium ion battery.

20. A battery management device according to claim 16, wherein the processing device comprises a processor, a random access memory, a read only memory, an input device, an output device, and a bus,
    wherein the bus connects the processor to one of more of the random access memory, the read only memory, the input device, and the output device, and
    the processor comprises a central processing unit.

\* \* \* \* \*